United States Patent [19]

Mooney

[11] Patent Number: 5,221,845
[45] Date of Patent: Jun. 22, 1993

[54] FRICTIONLESS LINEAR ACTUATOR

[75] Inventor: George Mooney, 24 Quebec Dr., Huntington Station, N.Y. 11746

[73] Assignee: George Mooney, Huntington Station, N.Y.

[21] Appl. No.: 807,191

[22] Filed: Dec. 16, 1991

[51] Int. Cl.⁵ .................................. H01J 37/20
[52] U.S. Cl. .................. 250/442.11; 250/491.1
[58] Field of Search .............. 250/442.11, 491.1

[56] References Cited

U.S. PATENT DOCUMENTS 2,347,348  4/1944  Young ..................... 250/442.11
3,622,830  11/1971 Clay ............................. 74/99
3,790,155  2/1974  Longamore ............. 250/442.11
4,965,862  10/1990 Freytsis et al. ........... 250/453.11

*Primary Examiner*—Bruce C. Anderson

[57] ABSTRACT

A device for positioning a target in the beam of a particle accelerator, which comprises a means for pivoting the actuator shaft within ultra high vacuum without sliding friction. The invention also comprises a means for removing the drive mechanism without releasing the vacuum, which simplifies the baking process, the invention also offers a simplified adjustment procedure, a lower profile, and a tamper proof cover.

8 Claims, 2 Drawing Sheets

5,221,845

FRICTIONLESS LINEAR ACTUATOR

BACKGROUND OF THE INVENTION

1. FIELD OF THE INVENTION

The invention relates generally to a device for centering a target in the beam of a particle accelerator, without violating the restrictions of sliding friction within the ultra high vacuum atmosphere.

2. DESCRIPTION OF THE PRIOR ART

Linear actuators currently in use employ a system that manipulates the entire drive mechanism outside the vacuum to locate the target in the desired position within the particle beam. Reaching through the vacuum bellows to the center of the beam tube, results in a target support member that has an eleven inch moment arm supported by a two and a half inch reaction. During the "bakeout period" the entire drive mechanism is subjected to elevated temperatures, and the resultant stresses of the heater blanket. The difficult positioning mechanism is exposed to tampering, which would cause the device to be removed, and reset. The drive mechanism cannot be removed without breaking the vacuum seal. Since the drive mechanism moves independently of the accelerator, flexible air hoses are required which are exposed to damage. The shaft, guide device, bellows, and pneumatic cylinder are on the same centerline, resulting in height that is not feasible for certain applications. Mounting the "tilt" baseplates for the drive mechanism requires an oversized custom vacuum flange, which covered by the tilt flanges, provides difficult access to the vacuum flange face, and electrical input ports. This invention eliminates all of these encumbrances.

SUMMARY OF THE INVENTION

The invention relates to a device that employs a unique frictionless pivoting guide within the ultra high vacuum atmosphere. The provision of this extra support for the drive member allows more freedom in the mechanical design of the drive mechanism, including removal of the drive mechanism without losing vacuum, a simpler baking procedure, a lower profile, more vacuum flange face access, a tamper proof-protective cover, a simpler method of positioning the target, a more stable support of the target, and lower cost.

DESCRIPTION OF THE PREFERRED EMBODIMENT

Figure 1:
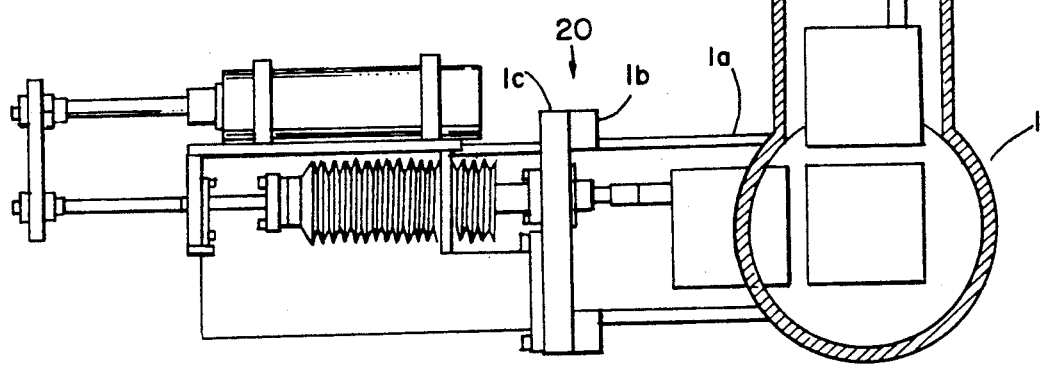
FIG. 1 shows a section view through a beam tube on which is mounted a preferred embodiment of this invention.

FIG. 1 illustrates a beam tube 1 in which a target 10 is mounted. Extending out from beam tube 1 is a pipe 1a on the end of which is mounted a flange 1b which supports a disk 9. On and through disk 9 as seen from the following discussion is mounted the device 10 incorporated the principles of this invention for centering target 10 within beam tube 1. Shown also in phantom is device 20 located at a 90 degree offset from the position shown in solid lines.

Referring to FIGS. 2 through 5, an embodiment of the invention is shown in which the pneumatic cylinder 11 is affixed to the support member 6. When the pneumatic cylinder is energized, the upper shaft member 3 compresses the bellows 7, and drives the lower shaft member 5, and the target 10 into the center of the beam of the particle accelerator.

The upper shaft member 3 comprises a stainless steel shaft using a fine thread at the upper end as a means for vertical adjustment of the target 10. There is also a flange fitted at the lower end, which is bored to a precision fit to index the lower shaft member. Machine screws are a means of fastening the upper shaft member 3 to the lower shaft member 5.

Figure 5:
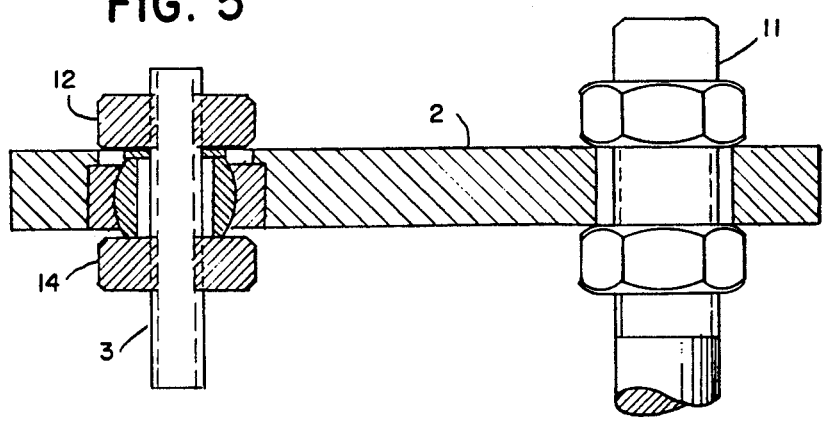
FIG. 5 shows a detail of the upper shaft guide.

The target 10 is positioned vertically by turning the adjustment nuts 12 and 14, also seen in FIG. 5, at the top of the upper shaft member 3, which establishes a vertically static position within the particle beam.

The target 10 is horizontally positioned by moving the upper shaft guide member 4, to the left or right. As seen also in FIG. 3, the upper shaft guide member 4 is comprised of a bronze bushing 16 affixed to a sliding member 18 by flat springs 22 and 24 this is a means to allow the bushing to be self aligning. Moving the upper shaft guide member 4, moves the upper shaft member 3. This causes the lower shaft member 5, to which it is affixed to pivot about the lower shaft guide 8, positioning the target 10, horizontally, within the particle beam.

The lower shaft member 5 comprises stainless steel shaft to which a "mini" vacuum flange is affixed at the top. When the vacuum flange is screwed to the top of the bellows 7, a copper gasket is deformed, providing a seal for the ultra high vacuum of ten to the minus eleven TORR. The bellows 7 is fitted at the bottom with the same vacuum type seal flange. This maintains the vacuum when the upper shaft and the drive mechanism are disconnected.

Figure 3:
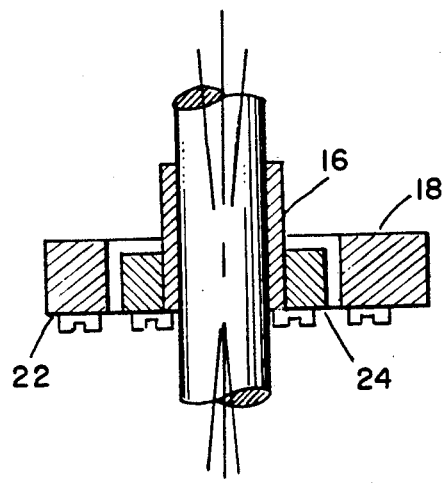
FIG. 3 shows a detail in section of the adjusting slide in the upper shaft guide assembly.
Figure 2:
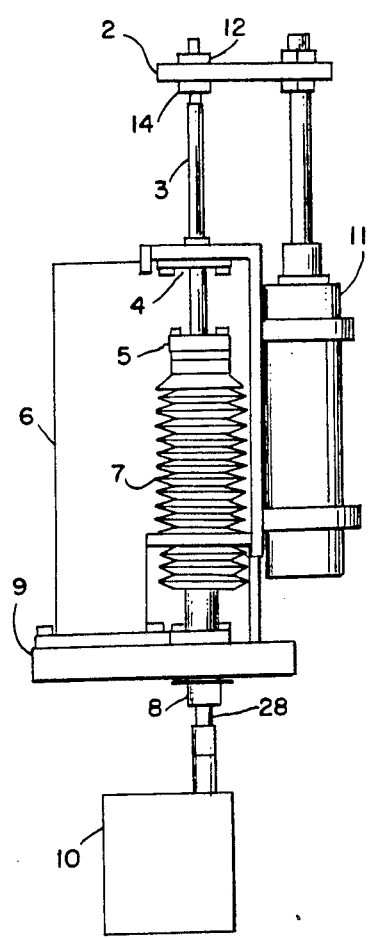
FIG. 2 shows a detail of the mechanism for positioning the target.
Figure 4:
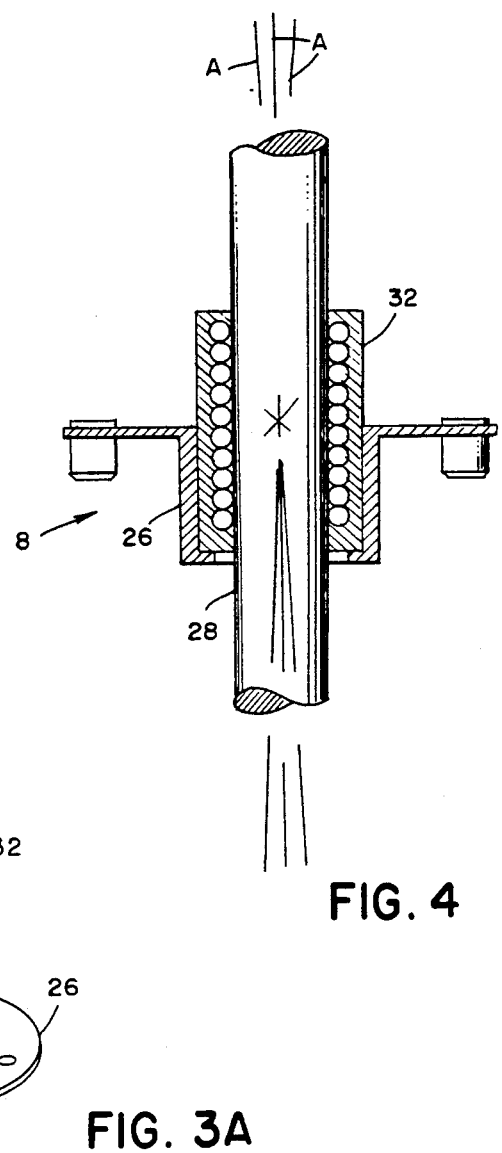
FIG. 4 shows a detail of the frictionless pivot bushing making up the lower shaft guide.
Figure 3A:
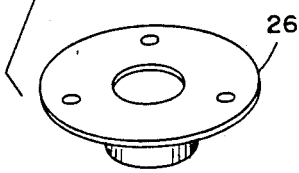
FIG. 3a shows an exploded view of the ball bushing and thin flexible flange illustrated in FIG. 3.

Lower shaft guide 8, as seen in FIG. 3, comprises a thin flexible flange 26 attached to disk 9. As shown by the centerline A of actuator shaft 28 and its rotated positions in phantom attached to target 10, when upper shaft guide member 4 is moved to the left or right, flange 26 containing ball bushing 32 is deformed and target 10 is moved horizontally within beam tube 1. In this arrangement, it is seen that this is accomplished without distorting bellows 7.

What is claimed is:

1. A low profile linear actuator for positioning a target member within containment means which comprises an accelerator tube containing a protected environment, said actuator comprising a shaft connected at one end to said target member within said accelerator tube and passing out through an opening in said containment means, a shaft guide comprising a thin flexible flange in said opening through which said shaft passes permitting said shaft to be both axially adjusted through said shaft guide, said flange being flexible permitting said shaft to be pivoted about said opening thereby allowing said member to be moved both axially and transversely within said containment means, bellows means outside of said containment means enclosing a portion of said shaft and said opening and being sealed to said shaft and to said containment means, support means having platform means for providing lateral support to said shaft outside of said bellows means and containment means including means to permit the axial movement of said shaft and the pivoting of said shaft with respect to said opening thereby allowing the position of said member within said containment means to be changed by sliding said shaft axially and pivoting said shaft, said support means including means for pivoting said shaft with respect to said opening comprising a guide member through which a portion of said shaft adjacent the other end of said shaft passes, said guide member being adjustable in a direction transverse to the axis of said shaft, and pneumatic drive means mounted on said support means along side said shaft and having a rod extending therefrom connected to the other end of said shaft for causing said shaft to move axially, thereby permitting access to and removal of said drive means without adversely affecting the integrity of the protected environment within said containment means, and permitting the baking of said bellows without exposing any part of said drive means to baking temperatures.

2. The linear actuator of claim 1 wherein said flange means includes a deformable flange and a ball bushing to permit frictionless pivoting of said shaft guide.

3. The linear actuator of claim 2 wherein said platform means includes an opening through which said shaft passes, said platform means including means for sliding said shaft transversely to change said angle and adjust the position of said member transversely to the axis of said shaft.

4. The linear actuator of claim 3 in which said sliding means includes self aligning bushing means.

5. The linear actuator of claim 4 in which said self aligning bushing means comprises a bushing with flat springs which flex for self alignment.

6. The linear actuator of claim 3 wherein the moment arm about said opening of said shaft to said member is less than the moment arm to said platform means.

7. The linear actuator of claim 1 in which said protected environment is an ultra high vacuum.

8. The linear actuator of claim 7 in which said accelerator tube is a beam tube.

* * * * *